United States Patent [19]

Bauer et al.

[11] Patent Number: 5,154,333
[45] Date of Patent: Oct. 13, 1992

[54] JAW CLEAVING DEVICE

[75] Inventors: Tibor L. Bauer, Hopewell Junction; William A. Cavaliere, Verbank; David C. Linnell, Poughkeepsie; Raymond R. Ruckel, Garrison, all of N.Y.

[73] Assignee: International Business Machines Corporation, Armonk, N.Y.

[21] Appl. No.: 784,702

[22] Filed: Oct. 30, 1991

[51] Int. Cl.[5] .................. H01L 21/80; B26F 3/00; B28D 5/00
[52] U.S. Cl. ................................ 225/1; 225/2; 225/101; 225/96.5; 437/225
[58] Field of Search ............ 225/1, 2, 96.5, 101; 437/225, 226, 227

[56] References Cited

U.S. PATENT DOCUMENTS 3,687,345 8/1972 Carlson et al. ................... 225/2

OTHER PUBLICATIONS

"Substrate Snapping Apparatus" J. F. Pollitt, Western Electric Technical Digest No. 60, Oct. 1980, pp. 17–18.

Primary Examiner—Hien H. Phan
Attorney, Agent, or Firm—Michael E. Whitham

[57] ABSTRACT

An apparatus and method for cleaving GaAs laser bars from a cell utilizes a first jaw applied to one end of a laser bar to propagate a cleavage and a second jaw applied to an opposite end which provides a biasing force that assures separation of the bar from the cell along the same crystallographic plane. The apparatus may be used in an ultra-high vacuum environment and allows handling of the bars without contacting the vital areas of the top surfaces or facet faces. The apparatus precisely locates bars after cleavage so that they may be further processed.

11 Claims, 3 Drawing Sheets

JAW CLEAVING DEVICE

BACKGROUND OF THE INVENTION

1. Field of the Invention

The present invention is generally related to a jaw cleaving apparatus and method for obtaining laser bars from large gallium arsenide (GaAs) cells and, more particularly, to the cleaving of GaAs bars from cells in an ultra-high vacuum environment.

2. Description of the Prior Art

Cleaving GaAs bars from cells is a key operation in the manufacture of laser devices. GaAs is very brittle and has a cuboidal crystal structure. FIG. 1 shows that if the GaAs bar is not cleaved along a precise crystallographic plane, the resulting laser bar 110 will have a shingled surface 111 which can be viewed with a high powered microscope. Laser bars 110 with this shingling defect will emit light 112, 114, and 116 at different planes 118, 120 and 122, respectively, along its face. Some light 124 emanating from the plane 120 may reflect off the side wall 126 of a portion of the laser bar 110 at a higher plane 118. Likewise, some light 128 and 130 emanating from the plane 122 may reflect off side walls 132 and 134, respectively. As can be seen from FIG. 1, the tendency of a laser bar 110 with a shingled surface 111 will be to disperse the light by reflections, thereby lowering the total amount of useful light emanating from the laser. In addition to reduced light output, having light impinge on a sidewall (e.g. 126, 132 or 134) will cause heat generation at the shingled surface 111 and may lead to catostrophic optical damage wherein portions of the face of laser bar 110 will break off due to heat damage.

After a GaAs bar is cleaved, it then must be packaged for shipment and later use. FIG. 2 shows that the exposed optical surface 74 of a GaAs bar 75 which results after cleaving will automatically form an oxide layer 77 due to reactions with $O_2$ and $H_2O$ in the ambient air. The oxide layer 77 absorbs light energy and causes diffusion 73. As discussed above, absorbtion of the light energy may result in catostrophic optical damage. One means by which growth of an oxide layer 77 can be avoided is to cleave the GaAs bars in a ultra-high vacuum environment which lacks the free $O_2$ and $H_2O$. However, if cleaving is performed in an ultra-high vacuum environment, vacuum suction tools which are now commonly in use for cleaving GaAs bars could not be employed since they would not have any suction pressure in the ultra-high vacuum environment. Furthermore, adhesives and the like could not be employed in the cleaving tool since they would outgas under the ultra-high vacuum pressure.

SUMMARY OF THE INVENTION

It is therefore an object of the present invention to provide an apparatus for cleaving GaAs bars from cells which may be utilized in an ultra high vacuum environment.

It is a further object of the present invention to provide an apparatus for producing GaAs bars which are free of damage to facet faces with no chipping and/or shingling and no contact at any time on vital areas of the top surface.

According to the invention, a GaAs cell is provided with margin areas which may be handled while the vital areas of the top surface and facet faces remain untouched and undamaged. Scribe lines are drawn along one margin of the cell to define the individual bars. The cell is then placed in a device which is constructed for use in an ultra-high vacuum environment. The cell is positioned for cleaving the individual GaAs bars using motor driven micrometers. A controlled load is applied to the margin area of an individual GaAs bar where the scribe line is located. A rotational force is applied to propagate the cleave. As the cleave proceeds toward the opposite margin, a second load acts on the bar to complete the cleave along the crystallographic plane and prevent premature breakage, or shingling. Once a bar is cleaved, it is precisely located in a carrier device and a protective anti-oxidant layer is applied.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF A PREFERRED EMBODIMENT OF THE INVENTION

Figure 1:
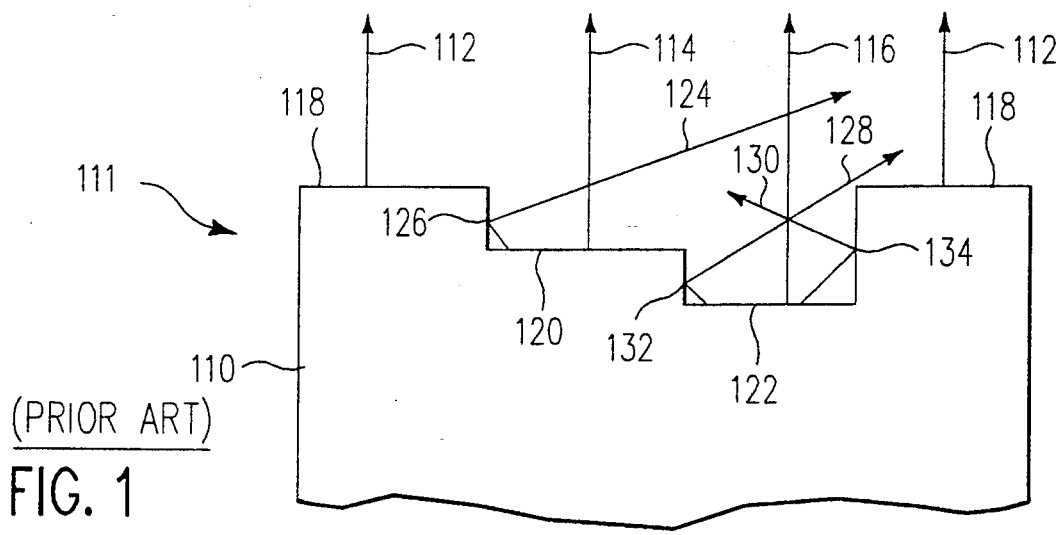
FIG. 1 is a top view of a GaAs laser bar having a shingled facet face.
Figure 2:
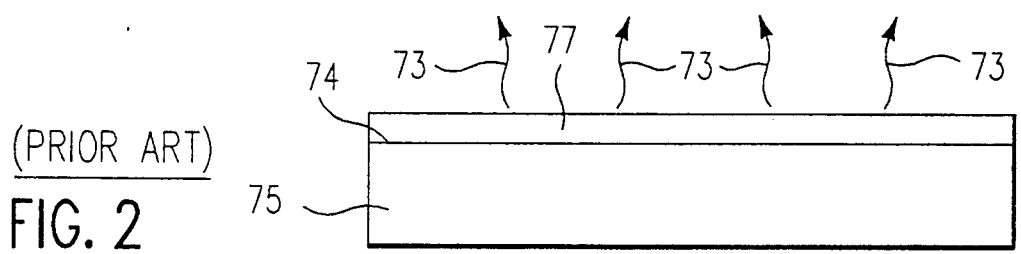
FIG. 2 is a top view of a GaAs laser bar on which an oxide layer has formed on the cleaved surface.
Figure 3:
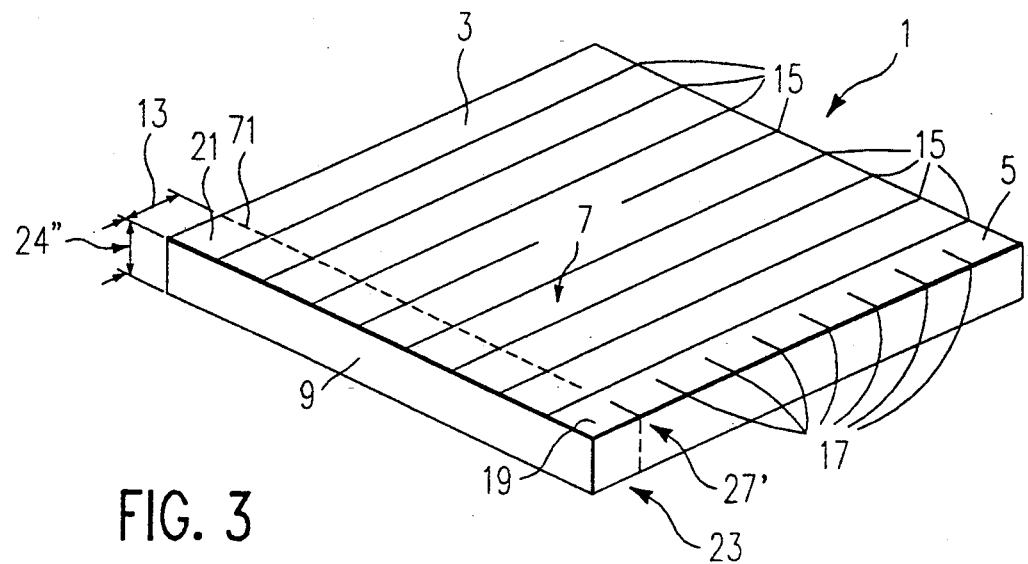
FIG. 3 is an isometric view of a GaAs cell which has been prepared for a cleaving operation.

Referring now to the drawings, and more particularly to FIG. 3, a GaAs cell 1 which has been prepared for cleaving is shown. Margin areas 3 and 5 are provided along opposite sides of the cell 1 to enable handling and locating the cell 1 without contacting any vital areas of the laser bars which are to be cleaved, such as the top surface 7 and the front 9 facet. A plurality of waveguides 15 are located parallel to the margin areas 3 and 5. The cell 1 is marked with scribe lines 17 in one margin area 5, perpendicular to the waveguides 15. The cell 1 must not be scribed on both sides 3 and 5, since it is highly unlikely that a cleave extending between scribe lines on opposite sides will occur on a single atomic plane. The scribe lines 17 preferably extend 1/64 the length between the sides 3 and 5.

Figure 4:
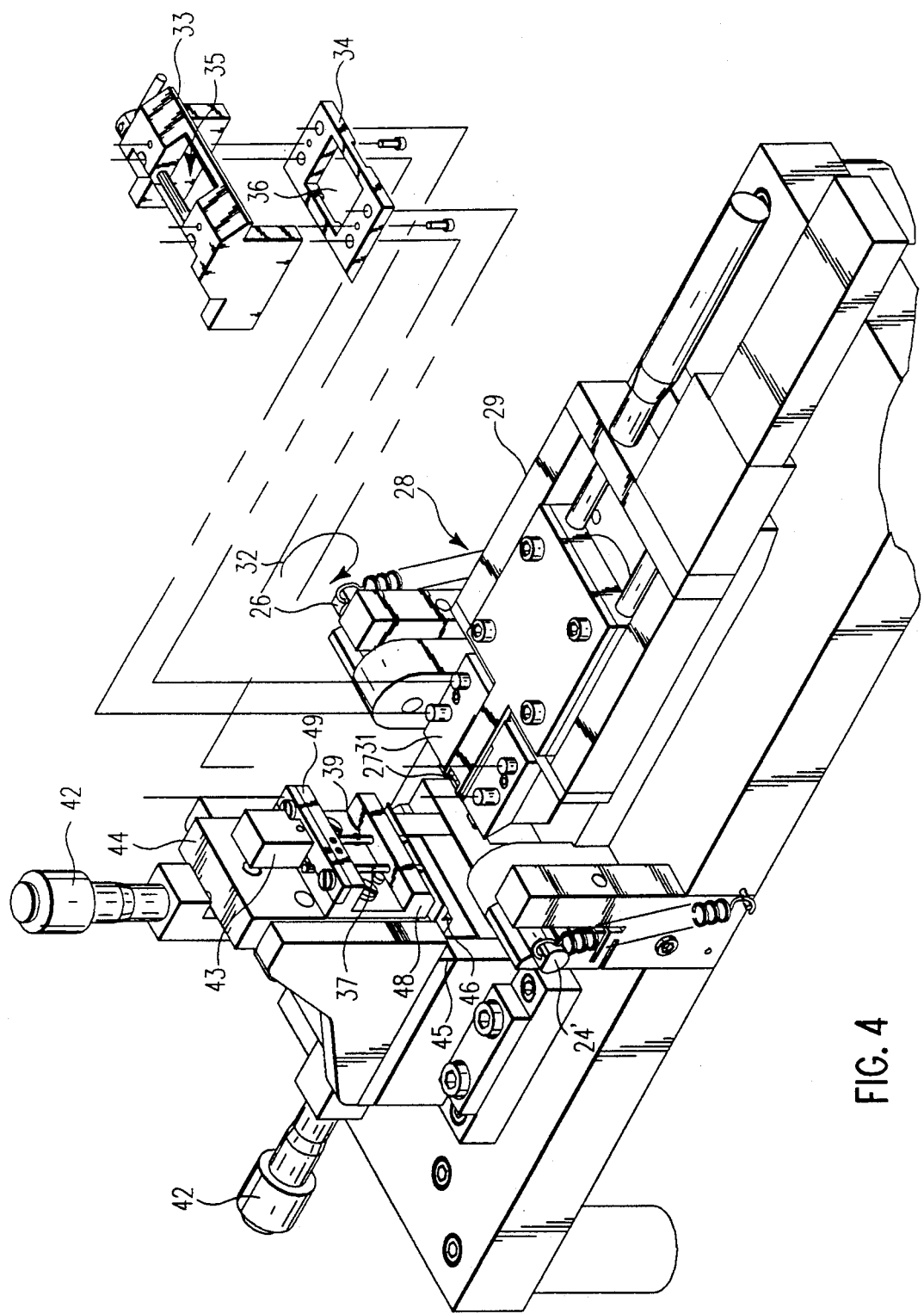
FIG. 4 is an isometric view of a jaw cleaving device according to the present invention.

FIG. 4 shows the jaw cleaving tool of the present invention. The cell 1 is placed in a guide 27. A weight 33 is positioned on a plate 34 which fits over the cell 1 to hold it in place. The plate 34 is designed to accomodate weights with varying loads. The weight 33 and plate 34 contain top openings 35 and 36 to prevent contact with the top surface 7 of the cell 1 and only contact the cell 1 on the margin areas 3 and 5. The cell 1 is advanced into the cleaving position which is one bar length 13 beyond a pivot point 31 via a motor driven micrometer 29.

With reference to FIGS. 3, 4 and 5a-c, a micropositioning stage 41 is used to lower pole shaped jaws 37 and 39 onto areas 19 and 21, respectively, of margin areas 3 and 5 of cell 1. Jaw 37 is firmly affixed to plate 49 and provides the primary force component used during cleavage of the bar 23 from the cell 1. Jaw 39 is slidable through a bore in plate 49 and includes a weight 43 positioned at its non-cleaving end. Jaw 39 is slightly longer than jaw 37 so that it contacts area 21 on bar 23 prior to jaw 37 contacting area 19, thereby lifting the weight 43 slightly above plate 49. Each of the jaws 37 and 39 project through bores in plate 48 which is spaced downward from plate 49. Plate 48 prevents lateral movement of the jaws 37 and 39 so that they always properly align with areas 19 and 21 on bar 23. The function of jaw 39 and weight 43 is to provide a downward force on the bar 23 as the cleave 24 progresses from one side of the cell 1 to the other, thereby preventing premature breakage and shingling of the bar 23.

In operation, the cell 1 is advanced to the cleavage position using micrometer 29. The micropositioning stage 45 is advanced into position using micrometer 44. Stage 45 locates a plate 46 underneath bar 23 of cell 1 to hold it in place after the cleaving operation until a carrier is in place and the bars can be transported for additional processing. Jaws 37 and 39 are lowered onto the areas 19 and 21 of bar 23 using micrometer 42, with jaw 39 contacting area 21 first and the weight 43 being slightly lifted above plate 49 when both jaws 37 and 39 are firmly in contact with bar 23. Once the bar 23 is properly positioned for cleavage and jaws 37 and 39 have been lowered, plate 28, on which the micrometer 29 and positioning guide 27 assembly is mounted, is pivoted about pins 24' and 26 in the rotational direction of arrow 32 to cleave the bar 23 from cell 1.

Figure 5A:
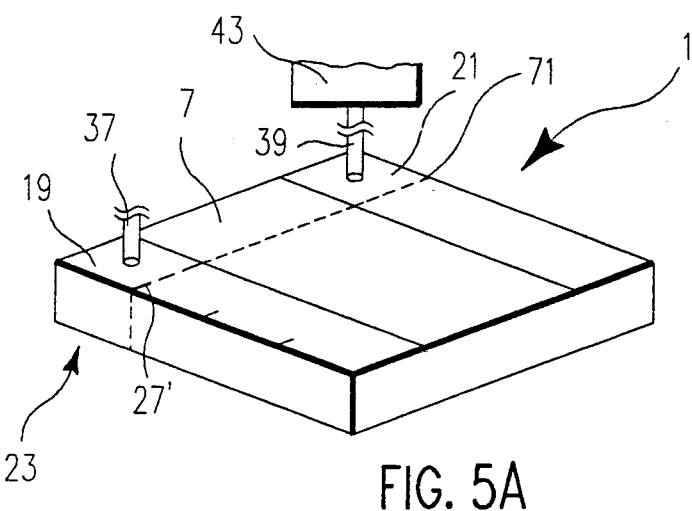
FIGS. 5a-c are sequential isometric views of a GaAs laser bar being separated from a cell.
Figure 5B:
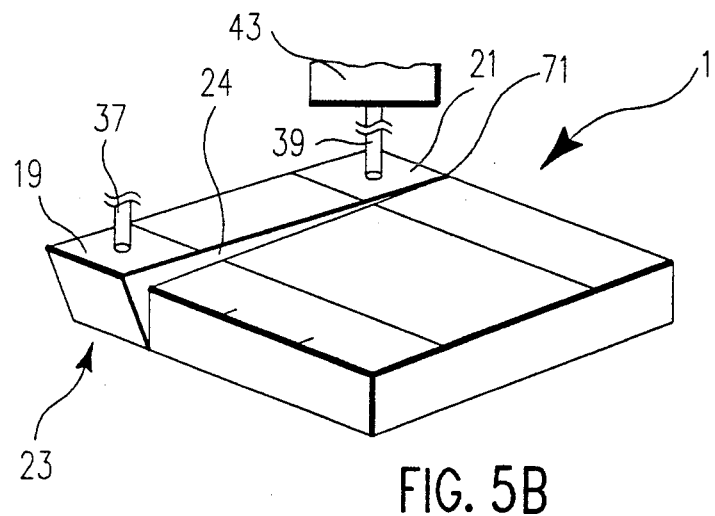
Figure 5C:
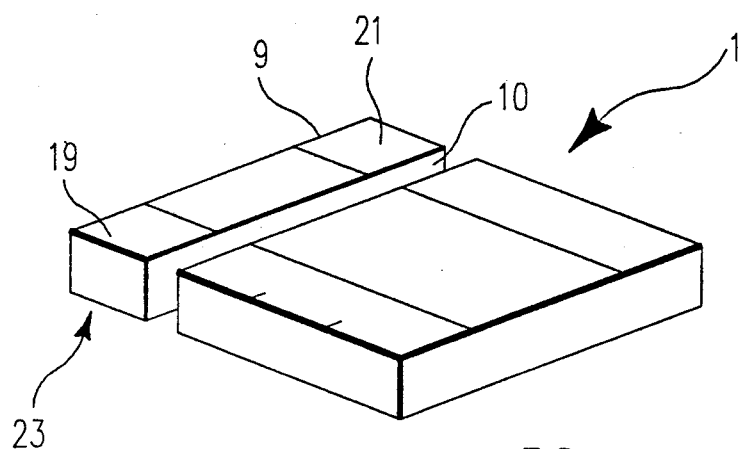

FIG. 5a shows both jaws 37 and 39 contacting areas 19 and 21, respectively, prior to the cleaving movement with plate 28 (FIG. 4). In this position, jaw 37 is stationary and jaw 39 has its downward force per unit area attributable to the weight 23 spread over almost the entire cell. FIG. 5b shows the cleave 24 progressing from one side of the cell 1 to the other as the plate 28 is pivoted. Pivotting the plate 28 causes the cell 1 to be rotated upward against the jaws 37 and 39. Since jaw 37 is stationary, the cell 1 starts to cleave at scribe line 27' under the force of cell 1 bearing against jaw 37 during the pivot movement. As the cleave 24 progresses across the cell 1, there would be a tendency for it to break off early (not traverse straight across the cell 1 on a single crystallographic plane 71, because the jaw 37 is located at the outside margin. This is where the jaw 39 plays a critical role in assuring that the cleave 24 continues to progress straight across the cell 1. With particular reference to FIG. 5b, it can be seen that the force per unit area exerted by weight 43 on jaw 39 becomes higher and higher as the cleave 24 progresses across the cell 1 because the area on which it exerts its downward pressure becomes smaller and smaller. When the cleave 24 is just about through the cell 1, the jaw 39 only exerts a downward pressure on its initial contact area 21 (as opposed to the entire cell 1). The load of the weight 43 should be varied in accordance with the thickness 24" of the cell 1. For example, it has been found that a weight of about 33 g is required for a cell having a thickness of about 150 μm. FIG. 5c shows the bar 23 cleaved from the cell 1. The resulting rear facet 10 is free of defects such as chipping or shingling.

After the first bar 23 is separated, the cell 1 is again advanced into the cleaving position by indexing it one bar beyond the crystallographic plane 71 and the process is repeated. A particular advantage of the present invention is that the bars are all precisely located after cleaving, thereby allowing them to be handled robotically for further processing such as applying a passivating layer. The precise location of the bar 23 is known from the position of the cell 1 which is controlled by micrometer 29, and by retaining the bar 23 in place on plate 46 after cleavage. Since the bar 23 is not dropped into a bin after cleavage, the exact location of the bar 23 on plate 46 is known and that position information can be used for further processing steps. The margin areas 3 and 5 enable the cleaved bars to be held in place without damage to the laser surface. When all of the bars have been cleaved from the cell, they are precisely located in a carrier. The bars are then passivated by evenly distributing a protective coating of silicon or other suitable anti-oxidant barrier layer of about a 20Å thickness on the surfaces.

The jaw cleaving tool of the present invention can cleave to a variety of different cavity lengths and cell sizes ranging in thickness from 0.25–0.76 mm without modification to the tool. The tool may be operated in an ultra-high vacuum environment to eliminate possible growth of an oxide layer on a cleaved surface of the laser bars. In addition, GaAs laser bars may be cleaved from cells without chipping or shingling along the crystallographic plane.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of cleaving a semiconductor bar from a cell, comprising:
   positioning a cell underneath a pair of jaws which are spaced apart to contact said cell in non-vital contact areas on a first side of said cell, a first of said pair of jaws being fixed and a second of said pair of jaws being slidable and biased by a weight;
   supporting a bar section to be cleaved from a cell at a position in line with said pair of jaws and spaced therefrom;
   placing said pair of jaws in contact with said non-vital contact areas on said cell; and
   pivoting a remainder section of said cell relative to said bar section of said cell when said jaws are in contact with said bar section.

2. The method of claim 1 wherein said steps of positioning, supporting, placing and pivoting are all performed in an ultra-high vacuum environment.

3. The method of claim 1 further comprising the steps of scribing a cell in a non-vital contact area with a scribe line, said scribe line defining an area for initiating a cleavage.

4. The method of claim 1 wherein said steps of positioning and supporting precisely locate said bar section of said cell at a known location after said step of pivoting.

5. The method of claim 4 further comprising the steps of retrieving said bar section from said known location and applying an antioxidant barrier layer to said bar section.

6. An apparatus for cleaving a semiconductor bar from a cell, comprising:
   positioning means for positioning a cell underneath a pair of jaws, said pair of jaws being spaced apart to contact said cell in non-vital contact areas on a first side of said cell;
   supporting means for supporting a bar section to be cleaved from a cell positioned in line with said pair of jaws and spaced therefrom;

placing means for placing said pair of jaws in contact with said non-vital contact areas, a first of said pair of jaws being fixed relative to said placing means, a second of said pair of jaws being movable relative to said placing means, said second of said pair of jaws being biased by a weight; and pivoting means for pivoting a remainder section of a cell relative to a bar section of said cell after said jaws are in contact with said bar section.

7. An apparatus as recited in claim 6 further comprising a weight for holding a cell in position, said weight having an opening which prevents contact with vital contact areas on a first side of said cell.

8. An apparatus as recited in claim 6 further comprising a means for preventing lateral movement of said pair of jaws.

9. An apparatus as recited in claim 6 wherein said second of said pair of jaws is longer than said first of said pair of jaws.

10. An apparatus as recited in claim 6 wherein said positioning means operates on a platform connected to said pivoting means.

11. An apparatus as recited in claim 6 wherein said positioning means and said supporting means serve to precisely locate a cleaved bar from a cell.

* * * * *